US011587899B2

(12) United States Patent
Tang et al.

(10) Patent No.: US 11,587,899 B2
(45) Date of Patent: Feb. 21, 2023

(54) MULTI-LAYER SEMICONDUCTOR PACKAGE WITH STACKED PASSIVE COMPONENTS

(71) Applicant: TEXAS INSTRUMENTS INCORPORATED, Dallas, TX (US)

(72) Inventors: Yiqi Tang, Allen, TX (US); Naweed Anjum, Murphy, TX (US); Liang Wan, Chengdu (CN); Michael Gerald Amaro, Naperville, IL (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/941,818

(22) Filed: Jul. 29, 2020

(65) Prior Publication Data

US 2022/0037280 A1    Feb. 3, 2022

(51) Int. Cl.
| | | |
|---|---|---|
| H01L 21/44 | (2006.01) | |
| H01L 23/52 | (2006.01) | |
| H01L 23/00 | (2006.01) | |
| H01L 23/58 | (2006.01) | |
| H01L 23/498 | (2006.01) | |
| H01L 21/56 | (2006.01) | |

(52) U.S. Cl.
CPC ............ *H01L 24/24* (2013.01); *H01L 21/568* (2013.01); *H01L 23/49861* (2013.01); *H01L 23/58* (2013.01); *H01L 24/82* (2013.01); *H01L 24/92* (2013.01); *H01L 2224/24195* (2013.01); *H01L 2224/24227* (2013.01); *H01L 2224/24265* (2013.01); *H01L 2224/32227* (2013.01); *H01L 2224/82005* (2013.01); *H01L 2224/82101* (2013.01); *H01L 2224/92244* (2013.01)

(58) Field of Classification Search
CPC ...... H01L 23/5227; H01L 23/58; H01L 24/82
USPC .......................... 257/750, 758; 438/642, 652
See application file for complete search history.

(56) References Cited

U.S. PATENT DOCUMENTS

| | | |
|---|---|---|
| 5,198,385 A | 3/1993 | Devitt et al. |
| 6,798,047 B1 | 9/2004 | Miks et al. |
| 7,582,963 B2 | 9/2009 | Gerber et al. |

(Continued)

FOREIGN PATENT DOCUMENTS

| | | |
|---|---|---|
| KR | 20100080352 | 8/2010 |
| RU | 2356127 | 5/2009 |

OTHER PUBLICATIONS

Yang et al., Semiconductor Device With Side-By-Side Packaging Solution, Texas Instruments Docket No. 90412PS, U.S. Appl. No. 62/804,495, filed Feb. 12, 2019.

*Primary Examiner* — Calvin Lee
(74) *Attorney, Agent, or Firm* — Yudong Kim; Frank D. Cimino

(57) ABSTRACT

A semiconductor package includes a first layer including a semiconductor die embedded within a dielectric substrate, and a first set of metal pillars extending through the dielectric substrate, a second layer stacked on the first layer, the second layer including a metal trace patterned on the dielectric substrate of the first layer, a passive component including at least one capacitor or resistor electrically coupled to the metal trace, and a second set of metal pillars extending from the metal trace to an opposing side of the second layer, and a third layer stacked on the second layer, the third layer including at least one inductor electrically coupled to metal pillars of the second set of metal pillars.

24 Claims, 10 Drawing Sheets

(56) References Cited

U.S. PATENT DOCUMENTS

| | | |
|---|---|---|
| 9,663,357 B2 | 5/2017 | Mao et al. |
| 10,104,764 B2 | 10/2018 | Stepniak et al. |
| 10,580,748 B2 * | 3/2020 | Kurokawa ............ H01L 29/205 |
| 10,832,985 B2 * | 11/2020 | Chiang ................... H01L 21/56 |
| 2009/0302436 A1 | 12/2009 | Kim et al. |
| 2010/0059853 A1 | 3/2010 | Lin et al. |
| 2012/0025269 A1 | 2/2012 | Parkhurst et al. |
| 2013/0082407 A1 | 4/2013 | Abbott et al. |
| 2015/0061103 A1 | 3/2015 | Manack et al. |
| 2019/0013288 A1 | 1/2019 | Kim et al. |
| 2020/0152616 A1 * | 5/2020 | Kuo .................... H01L 23/5226 |
| 2020/0258825 A1 * | 8/2020 | Tang ....................... H01L 24/32 |
| 2020/0411460 A1 * | 12/2020 | Park .................... H01L 23/5226 |
| 2021/0035922 A1 * | 2/2021 | Tokuya ................. H01L 23/562 |
| 2021/0202395 A1 * | 7/2021 | Lu ........................... H01L 24/05 |
| 2021/0327829 A1 * | 10/2021 | Sridharan ......... H01L 23/49503 |
| 2021/0375765 A1 * | 12/2021 | Tseng .................. H01L 23/5384 |

* cited by examiner

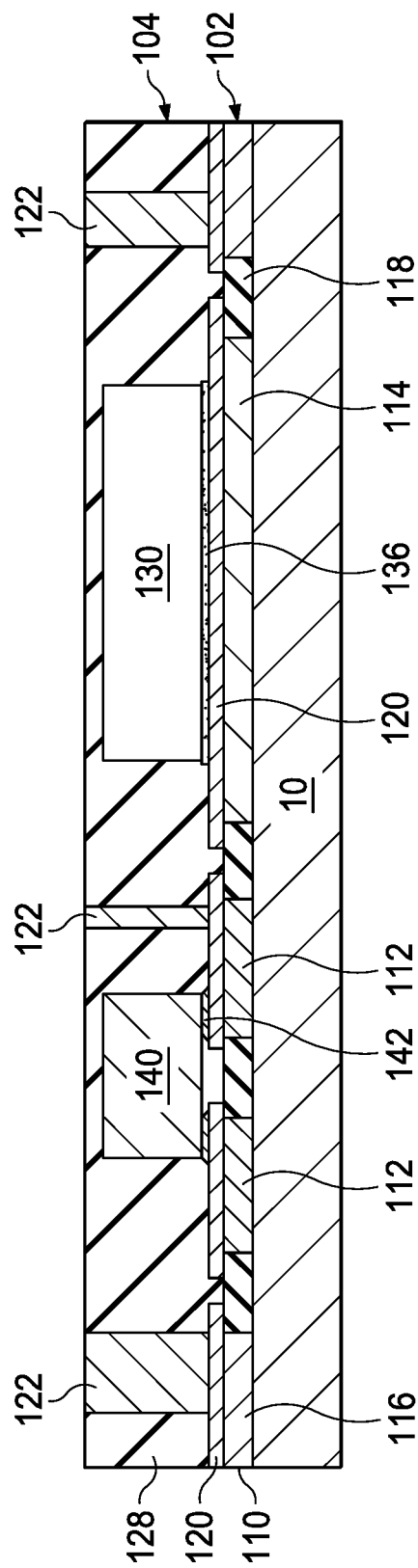
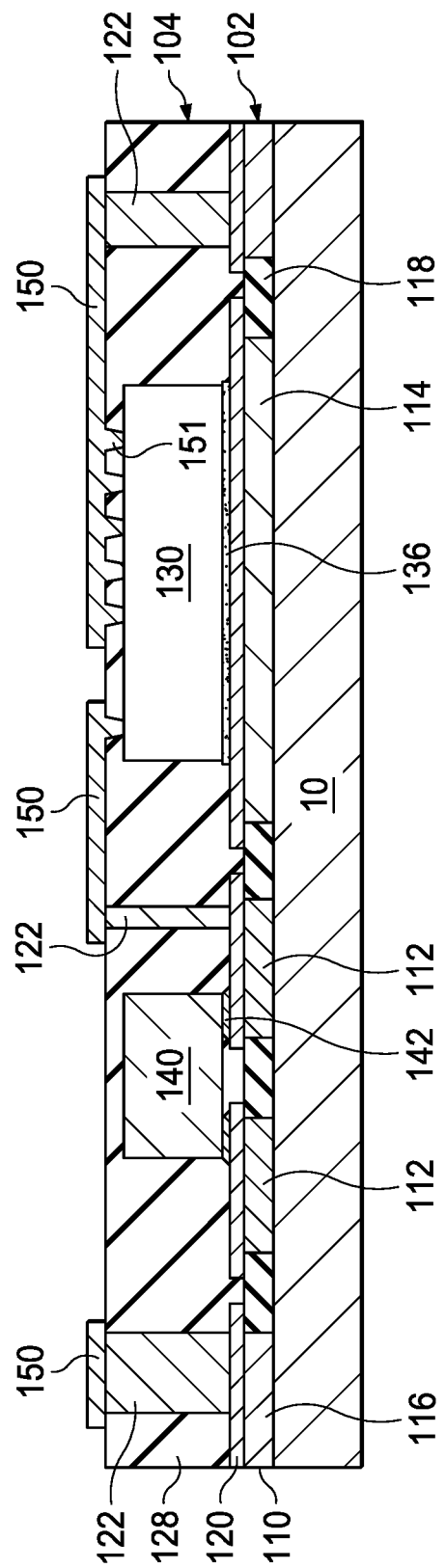
FIG. 2C
FIG. 2D

US 11,587,899 B2

MULTI-LAYER SEMICONDUCTOR PACKAGE WITH STACKED PASSIVE COMPONENTS

TECHNICAL FIELD

This disclosure relates to semiconductor packages.

BACKGROUND

Electronic package technology continues trends towards miniaturization, integration, and speed. Semiconductor packages provide support for an integrated circuit chip or semiconductor die and associated bond wires, provide protection from the environment, and enable surface-mounting of the die to and interconnection with an external component, such as a printed circuit board (PCB). Leadframe semiconductor packages are well known and widely used in the electronics industry to house, mount, and interconnect a variety of ICs.

A conventional leadframe is typically die-stamped from a sheet of flat-stock metal and includes a plurality of metal leads temporarily held together in a planar arrangement about a central region during package manufacture by siderails forming a rectangular frame. A mounting pad for a semiconductor die is supported in the central region by "tie-bars" that attach to the frame. The leads extend from a first end integral with the frame to an opposite second end adjacent to, but spaced apart from, the die pad.

As alternatives to a conventional leadframe, routable leadframes include at least one metal layer supported by a dielectric layers, such as laminate films and/or premolded dielectric layers.

A power converter module comprises at least an integrated IC with both power and controller functions, an input capacitor, an output capacitor, and an inductor. These components may be combined into a single package. In one example of a switching power converter package, the controller chip, the inductor, and the capacitors are placed side-by-side on a leadframe or routable substrate. In another example, the controller chip may be embedded in the substrate so that only the inductor and the capacitors are on the surface of the substrate.

BRIEF SUMMARY

Packages disclosed herein include a semiconductor die embedded within a dielectric layer of the package. Additional package layers include passive components, such as resistors and capacitors. Electrical traces provide electrical connections within a layer, whereas metal pillars extend between layers. The disclosed examples facilitate additional density for packages, including additional power density for power converter modules compared to existing layers, such as examples with all components on one layer as well as examples with side-by-side surface-mount components over an embedded controller chip.

In one example, a semiconductor package includes a first layer including a semiconductor die embedded within a dielectric substrate, and a first set of metal pillars extending through the dielectric substrate, a second layer stacked on the first layer, the second layer including a metal trace patterned on the dielectric substrate of the first layer, a passive component including at least one capacitor or resistor electrically coupled to the metal trace, and a second set of metal pillars extending from the metal trace to an opposing side of the second layer, and a third layer stacked on the second layer, the third layer including at least one inductor electrically coupled to metal pillars of the second set of metal pillars.

In another example, a semiconductor package includes a base layer including a leadframe and a base layer dielectric substrate filling gaps between elements of the leadframe, and a first layer including a semiconductor die embedded within a second dielectric substrate, and a first set of metal pillars extending through the second dielectric substrate. The first layer is stacked on the base layer such that the first set of metal pillars are electrically coupled to the elements of the leadframe. The semiconductor package further includes a second layer stacked on the first layer, the second layer including a metal trace patterned on the second dielectric substrate, a passive component including at least one capacitor or resistor electrically coupled to the metal trace, and a second set of metal pillars extending from the metal trace to an opposing side of the second layer, and a third layer stacked on the second layer, the third layer including at least one inductor electrically coupled to metal pillars of the second set of metal pillars. The inductor is exposed on an outer surface of the semiconductor package.

In a further example, a method of forming a package includes grinding a layer of a dielectric substrate that covers a semiconductor die and a first set of metal pillars such that distal ends of the first set of metal pillars are exposed adjacent a surface of the dielectric substrate, patterning a metal trace over the dielectric substrate with the first set of metal pillars electrically connected to the metal trace, plating a second set of metal pillars over the metal trace, placing a passive component including at least one capacitor or resistor on the metal trace, electrically coupling the passive component to the metal trace, and placing at least one inductor over the metal pillars of the second set of metal pillars to electrically couple the inductor to the metal pillars of the second set of metal pillars.

BRIEF DESCRIPTION OF THE DRAWINGS

FIGS. 2A-2G illustrate conceptual process steps for manufacturing the package of FIGS. 1A and 1B.

DETAILED DESCRIPTION

Figure 1A:
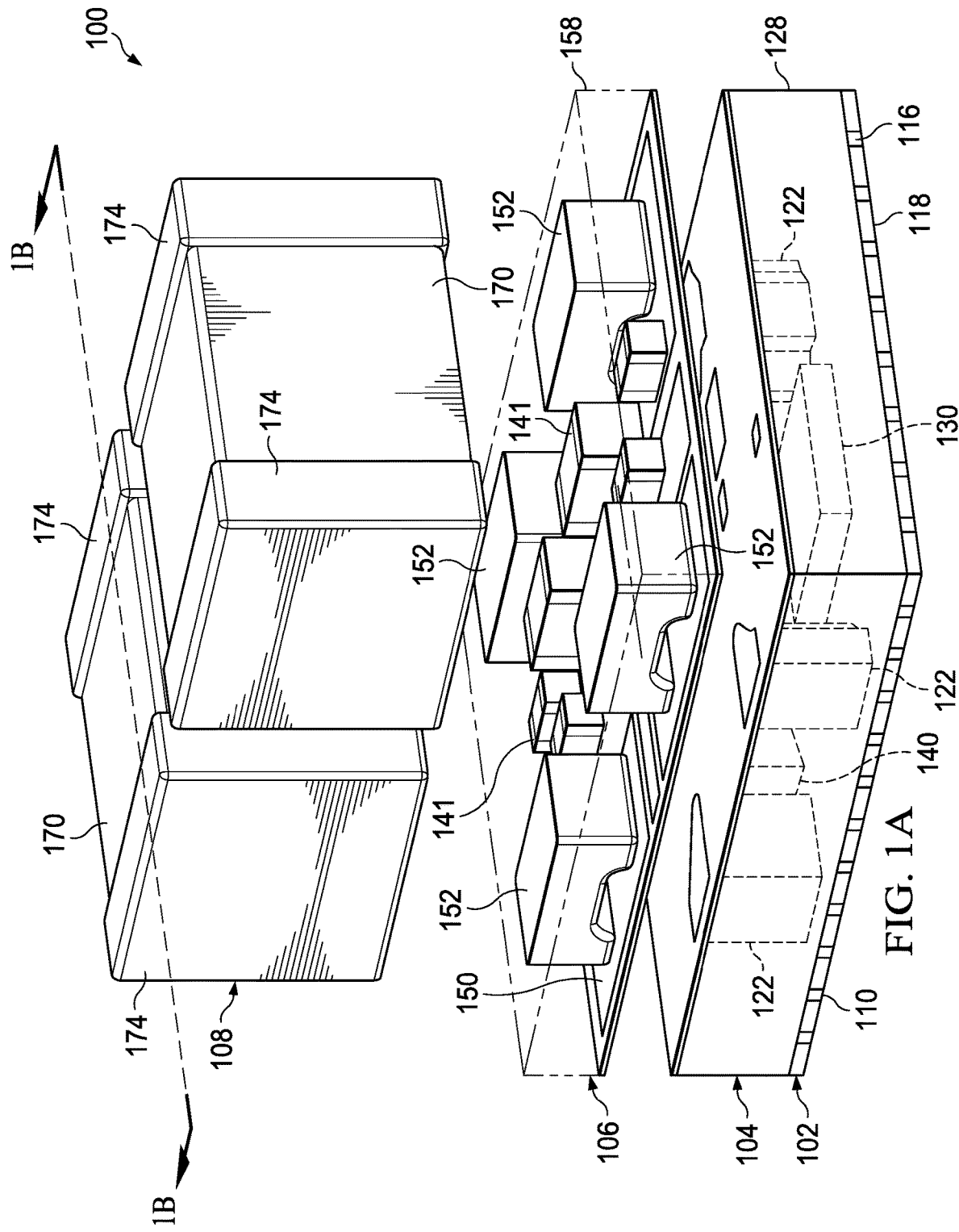
FIGS. 1A and 1B illustrate a multilayer package with an embedded semiconductor die, a second layer with embedded passive components, and an open layer with passive components.
Figure 1B:
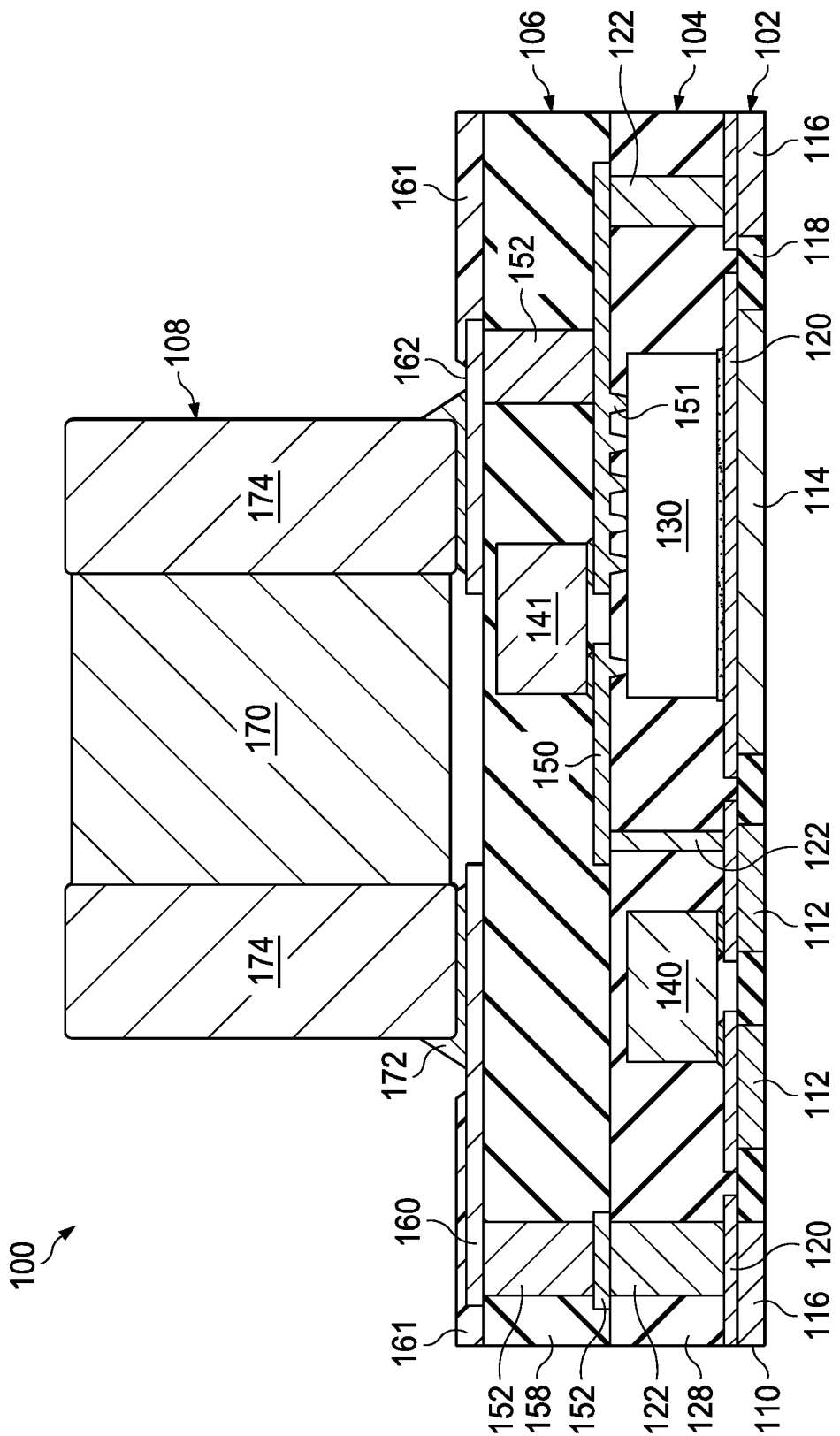

FIGS. 1A and 1B illustrate semiconductor package 100. Specifically, FIG. 1A illustrates a perspective view of semiconductor package 100, and FIG. 1B illustrates a cross-sectional view of semiconductor package 100. Semiconductor package 100 includes a first layer 104 including a semiconductor die 130 embedded in a dielectric substrate 128, a second layer 106 including passive components 141 embedded in a dielectric substrate 158, and a third layer 108 including surface-mount components including inductors 170. Semiconductor package 100 also includes a base layer 102 including a leadframe 110 and a base layer dielectric substrate 118 filling gaps between the elements of the leadframe 110.

A metal trace 120 is a metal plating layer patterned on base layer 102 and extends over leadframe 110 and base layer dielectric substrate 118. First layer 104 is stacked on base layer 102 such that a set of metal pillars 122 embedded in dielectric substrate 128 are electrically coupled to leadframe 110 via metal trace 120. Metal pillars as referred to herein may also be referred to as metal bridges in they provide electrical connections that bridge between the distinct conductive layers of semiconductor package 100. Specifically, metal pillars 122 are electrically coupled to elements of leadframe 110 via metal trace 120. In addition, passive component 140 includes electrical terminals physically and electrically connected to metal trace 120, and an inactive surface of semiconductor die 130 adjacent to and in physical contact with metal trace 120.

A second metal trace 150 is patterned on first layer 104 and extends over dielectric substrate 128 and the distal ends of metal pillars 122. Second layer 106 is stacked on first layer 104 such that a second set of metal pillars 152 are electrically coupled to metal pillars 122 via metal trace 150. Metal pillars 122 extend through dielectric substrate 128 to provide electrical connections between metal traces 120, 150. Passive components 141 and other components of second layer 106, if any, include terminals or other electrical contacts physically and electrically connected to metal trace 150. In some examples, passive components 141 include at least one capacitor and/or resistor.

Semiconductor die 130 includes bond pads providing electrical connections to its functional circuitry. The bond pads are electrically coupled to metal trace 150 patterned on dielectric substrate 128. Specifically, dielectric substrate 128 forms vias 151, which are filled with the conductive material of metal trace 150 over the bond pads, electrically connecting the functional circuitry of semiconductor die 130 to metal trace 150. A metal trace 160 is patterned on second layer 106 and extends over dielectric substrate 158, and metal pillars 152 extend from metal trace 150 to an opposing side of second layer 106, through dielectric substrate 158, to provide electrical connections between metal traces 150, 160.

Third layer 108, including inductors 170, is stacked on second layer 106. Inductor 170 remains exposed on an outer surface of semiconductor package 100 rather than embedded within a dielectric layer. In this manner, the electrical components of third layer 108 are surface-mount components. Each inductor 170 includes inductor terminals 174, each inductor terminal 174 being electrically coupled to one or more metal pillars 152 via electrically conductive adhesive material 172, such as solder or Ag-Sintered material, to electrical contacts 162 of metal trace 160. In other examples, metal trace 160 may be omitted, and one or more of inductor terminals 174 may be directly coupled to one or more metal pillars 152. Portions of metal trace 160 are covered by a solder mask layer 161, leaving exposed electrical contacts 162 to facilitate electrical connections with electrical components of third layer 108.

In this manner, metal pillars 122, 152 and metal traces 120, 150, 160 provide routable three-dimensional electrical connections between leadframe 110 and the components of first layer 104, second layer 106 and third layer 108. The multi-layer configuration facilitates additional density for packages, including additional power density for power converter modules compared to existing layers, such as examples with all components on one layer as well as examples with side-by-side surface-mount components over an embedded controller chip. While semiconductor package 100 includes two embedded components layers and one surface-mount component layer, other examples may include additional layers.

In some examples, leadframe 110 may be a premolded leadframe including conductive elements and base layer dielectric substrate 118. The conductive elements of leadframe 110 include perimeter contacts 116, interior vias 112, and a die attach pad 114. The conductive elements combine to define opposed, generally planar top and bottom surfaces. Base layer dielectric substrate 118 fills the gaps between the conductive elements, extending between the generally planar top and bottom surfaces. The inactive surface of semiconductor die 130 mounted on die attach pad 114, and an exposed surface of die attach pad 114 facilitates conductive cooling of semiconductor die 130. Portions of leadframe 110 may be covered by a dielectric layer (not shown), such as a solder mask layer, with portions of perimeter contacts 116, and optionally, interior vias 112, remaining exposed to facilitate connections between semiconductor package 100 and an external component, such as a PCB.

Leadframes, such as leadframe 110, are formed on a single, thin sheet of metal as by stamping or etching. Multiple interconnected leadframes may be formed on a single leadframe sheet, the interconnected leadframes referred to as a leadframe strip. Leadframes on the sheet can be arranged in rows and columns. Tie bars connect leads and other elements of a leadframe to one another as well as to elements of adjacent leadframes in a leadframe strip. A siderail may surround the array of leadframes to provide rigidity and support leadframe elements on the perimeter of the leadframe strip. The siderail may also include alignment features to aid in manufacturing.

Usually die mounting, die to leadframe attachment, such as solder reflowing, wire bonding or metal trace pattering, and molding to cover at least part of the leadframe and dies take place while the leadframes are still integrally connected as a leadframe strip. After such processes are completed, the leadframes, and sometimes mold compound of a package, are severed ("singulated" or "diced") with a cutting tool, such as a saw or laser. These singulation cuts separate the leadframe strip into separate IC packages, each IC package including a singulated leadframe, at least one die, electrical connections between the die and leadframe (such as gold or copper bond wires) and the mold compound which covers at least part of these structures.

Tie bars and siderails may be removed during singulation of the packages. The term leadframe of represents the portions of the leadframe strip remaining within a package after singulation. With respect to semiconductor package 100, leadframe 110 includes perimeter contacts 116, interior vias 112, and die attach pad 114 although those conductive elements are not directly interconnected following singulation of semiconductor package 100.

In the particular example of leadframe 110, the interconnected leadframes may be molded with base layer dielectric substrate 118 prior to mounting components to leadframe 110 such that leadframe 110 represents a premolded leadframe. Such premolding provides additional rigidity and support for the conductive elements of leadframe 110 during manufacturing to limit warpage or other damage during manufacturing. Additional dielectric layers, including dielectric substrates 128, 158 may be molded over the premolded leadframe after patterning of adjacent metal traces and placement of components within those layers.

An inactive surface of semiconductor die 130 is bonded to metal trace 120 over die attach pad 114 of leadframe 110. Semiconductor die 130 comprises a substrate (e.g., silicon or silicon/germanium) having an active surface and an inactive surface. Bond pads are exposed in bond pad openings in a dielectric layer of semiconductor die 130 on its active surface. The bond pads are bonded to a metallization layer including functional circuitry (not shown) in a semiconductor substrate. The functional circuitry of semiconductor die 130 is formed on a semiconductor wafer prior to singulation of semiconductor die 130 and includes circuit elements such as transistors, diodes, capacitors, and resistors, as well as signal lines and other electrical conductors that interconnect the various circuit elements. As nonlimiting examples, such functional circuitry may include an application specific integrated circuit (ASIC), a digital signal processor, a radio frequency chip, a memory, a microcontroller and a system-on-a-chip or a combination thereof. The functional circuitry is generally integrated circuitry that realizes and carries out desired functionality of the package, such as that of a digital IC (e.g., digital signal processor) or analog IC (e.g., amplifier or power converter), such as a BiMOS IC. The capability of functional circuitry may vary, ranging from a simple device to a complex device.

Dielectric substrates 118, 128, 158 provide protective layers covering electronics of semiconductor package 100, including semiconductor die 130, passive components 140, 141, and metal pillars 122, 152. Dielectric substrates 118, 128, 158 may be formed from a nonconductive plastic or resin material. One or more of dielectric substrates 118, 128, 158 may be molded components. Mold compounds suitable for use as dielectric substrates 118, 128, 158 include, for example, thermoset compounds that include an epoxy novolac resin or similar material combined with a filler, such as alumina, and other materials to make the compound suitable for molding, such as accelerators, curing agents, filters, and mold release agents.

FIGS. 2A-2G illustrate conceptual process steps for manufacturing semiconductor package 100. FIG. 3 is flowchart of a method of manufacturing a multilayer package with an embedded semiconductor die additional package layers including passive components. For clarity, the techniques of FIG. 3 are described with respect to semiconductor package 100 and FIGS. 2A-2G; however, the described techniques may also be readily adapted to alternative package configurations, including packages 300, 400, as described with respect to FIGS. 4A-5.

Figure 2A:
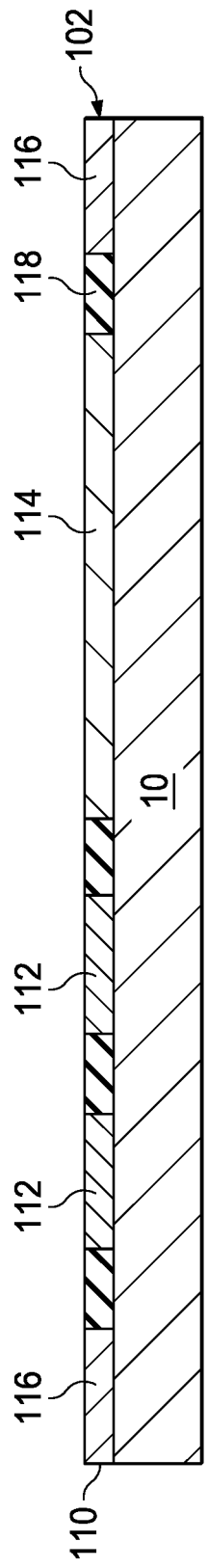
Figure 3:
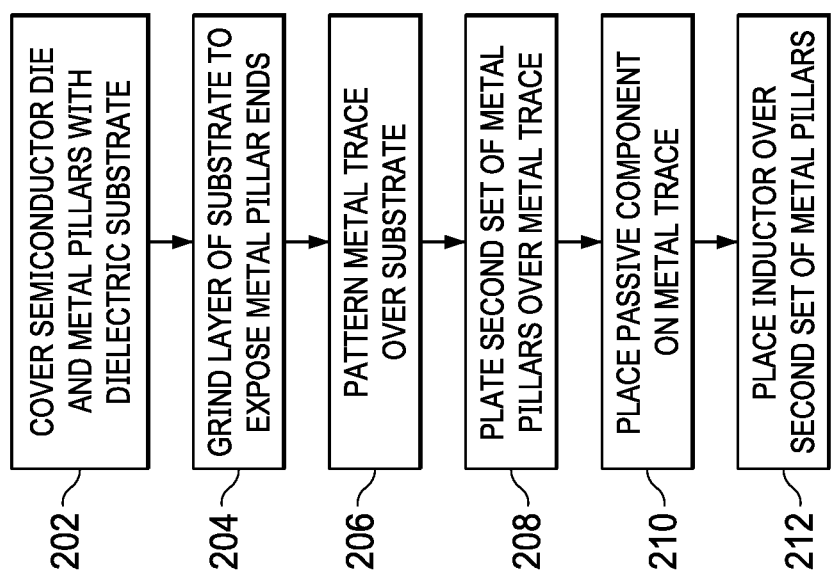
FIG. 3 is flowchart of a method of manufacturing a multilayer package with an embedded semiconductor die additional package layers including passive components, such as the package of FIGS. 1A and 1B.

FIG. 2A illustrates base layer 102 with a premolded leadframe 110 on a carrier 10, such as a metal carrier or glass carrier. Carrier 10 provides support for unfinished layers of semiconductor package 100 during manufacturing. An adhesive, such as thermal or UV sensitive adhesive, holds base layer 102 to carrier 10. Premolded leadframe 110 includes conductive elements and base layer dielectric substrate 118. The conductive elements of leadframe 110 include perimeter contacts 116, interior vias 112, and a die attach pad 114.

Figure 2B:
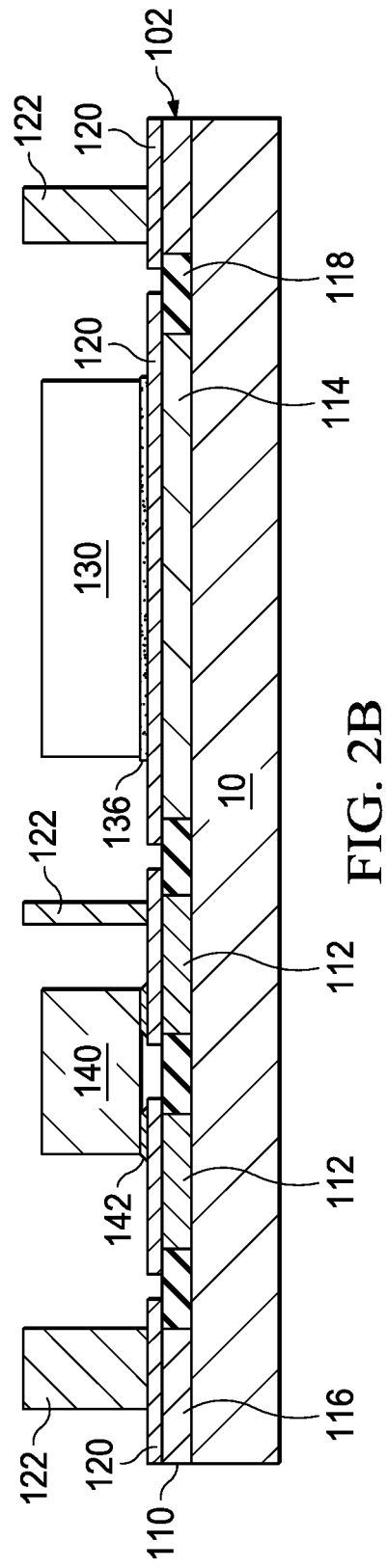

As represented by FIG. 2B, components of first layer 104 are added to base layer 102. First, trace 120 is plated as a patterned metal layer over premolded leadframe 110, electrically connecting trace 120 to the conductive elements of leadframe 110. Then, metal pillars 122 are patterned over trace 120. In some examples, patterning metal pillars 122 may include plating multiple layers of metal over trace 120 to build-up metal pillars 122 to a desired height.

Before or after plating metal pillars 122, semiconductor die 130 is mounted to leadframe 110 by mounting an inactive side of semiconductor die 130 to die attach pad 114 of leadframe 110 with die attach paste 136. Optionally, trace 120 may cover die attach pad 114 such that the inactive side of semiconductor die 130 is in contact with trace 120 on die attach pad 114. Similarly, before or after plating metal pillars 122, passive component 140 is mounted to electrical contacts of trace 120 with electrically conductive adhesive material 142, such as solder or Ag-Sintered material, thereby physically and electrically connecting passive component 140 to metal trace 120. In various examples, solder bonding or metal-to-metal bonding may be used to connect passive component 140 to metal trace 120.

As represented by FIG. 2C, the partially assembled device of FIG. 2B is molded, thereby covering, semiconductor die 130, passive component 140, and metal pillars 122 with a dielectric substrate 128 (FIG. 3, step 202). Dielectric substrate 128 may encapsulate the components of first layer 104, although distal ends of metal pillars 122 may remain exposed following molding. After molding, the process includes grinding a layer of dielectric substrate 128 to expose distal ends of metal pillars 122 adjacent a surface of dielectric substrate 128 (FIG. 3, step 204). Grinding also provide a flat surface for dielectric substrate 128 in a common plane with the exposed distal ends of metal pillars 122.

As represented by FIG. 2D, a metal trace 150 is patterned over dielectric substrate 128 with metal pillars 122 electrically connected to metal trace 150 (FIG. 3, step 206). Vias 151 are drilled, chemically etched or plasma-etched into dielectric substrate 128 to expose the bond pads on the active side of semiconductor die 130 prior to plating metal trace 150. The plating layer of metal trace 150 fills vias 151, electrically connecting the functional circuitry of semiconductor die 130 to metal trace 150.

Figure 2E:
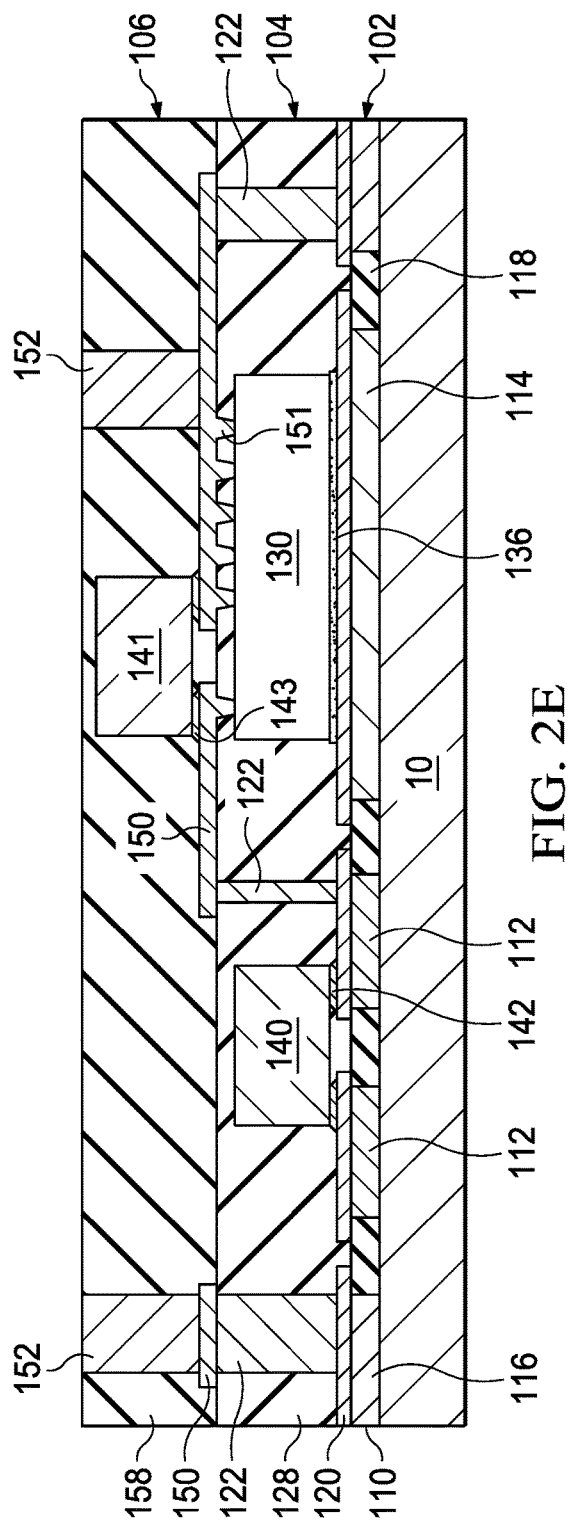

As represented by FIG. 2E, the other components of second layer 106 are added over metal trace 150. Metal pillars 152 are patterned over trace 150 (FIG. 3, step 208). In some examples, patterning metal pillars 152 may include plating multiple layers of metal over trace 150 to build-up metal pillars 152 to a desired height. Similarly, before or after plating metal pillars 152, passive component 141 is mounted to electrical contacts of trace 150 with electrically conductive adhesive material 143, such as solder or Ag-Sintered material, thereby physically and electrically connecting passive component 141 to metal trace 150 (FIG. 3, step 210). In various examples, solder bonding or metal-to-metal bonding may be used. Passive component 141 may include at least one capacitor or resistor.

As further represented by FIG. 2E, the partially assembled device including the exposed components of second layer 106 is molded, thereby covering passive component 141, and metal pillars 152 with a dielectric substrate 158. Dielectric substrate 158 may encapsulate the components of second layer 106, although distal ends of metal pillars 152 may remain exposed following molding. After molding, the process includes grinding a layer of dielectric substrate 158 to expose distal ends of metal pillars 152 adjacent a surface of dielectric substrate 158 (FIG. 3, step 204). Grinding also provide a flat surface for dielectric substrate 158 in a common plane with the exposed distal ends of metal pillars 152.

Figure 2F:
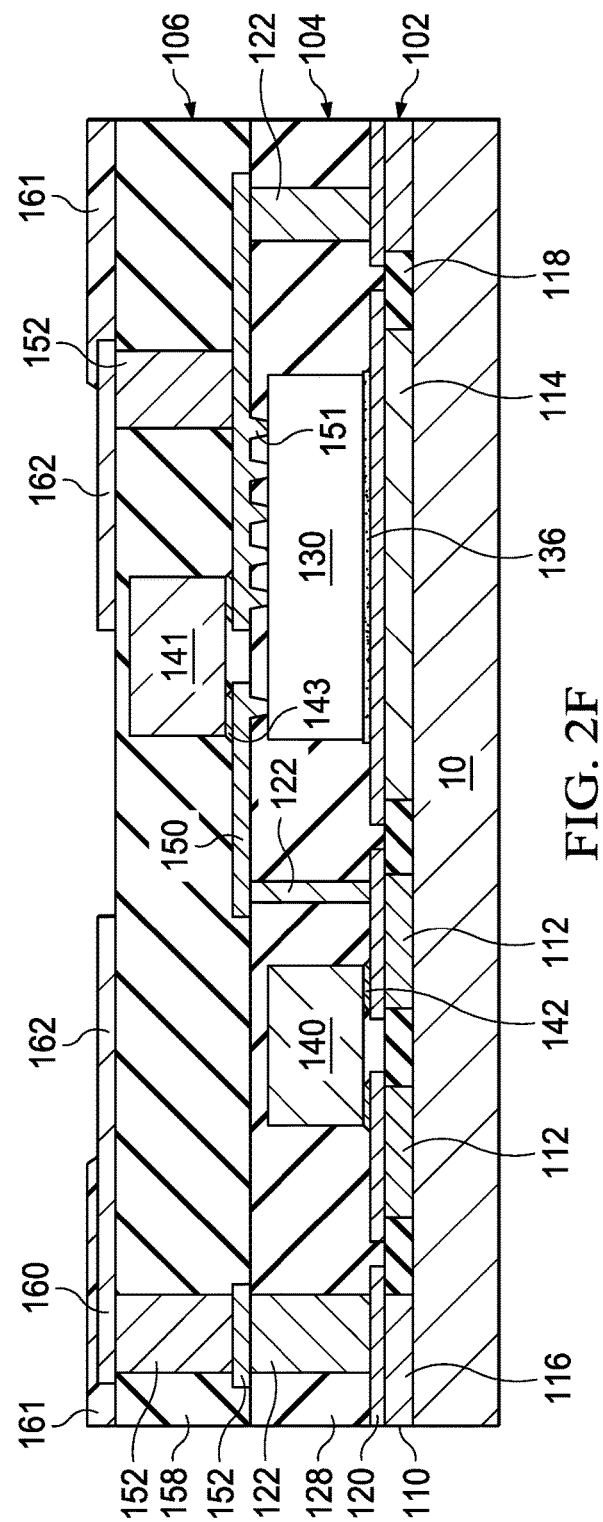

As represented by FIG. 2F, a metal trace 160 is patterned over dielectric substrate 128 with metal pillars 152 electrically connected to metal trace 160 (FIG. 3, step 206). A solder mask layer 161 optionally covers portions of metal trace 160, leaving solder mask defined electrical contacts 162 exposed for mounting electrical components.

In other examples, such as semiconductor package 300 (FIGS. 4A and 4B), a second layer may not include a dielectric substrate, and may include surface-mount components rather than embedded components. In such examples, components of the third layer may mount directly to metal pillars of the second layer, rather than to metal trace 160.

Figure 2G:
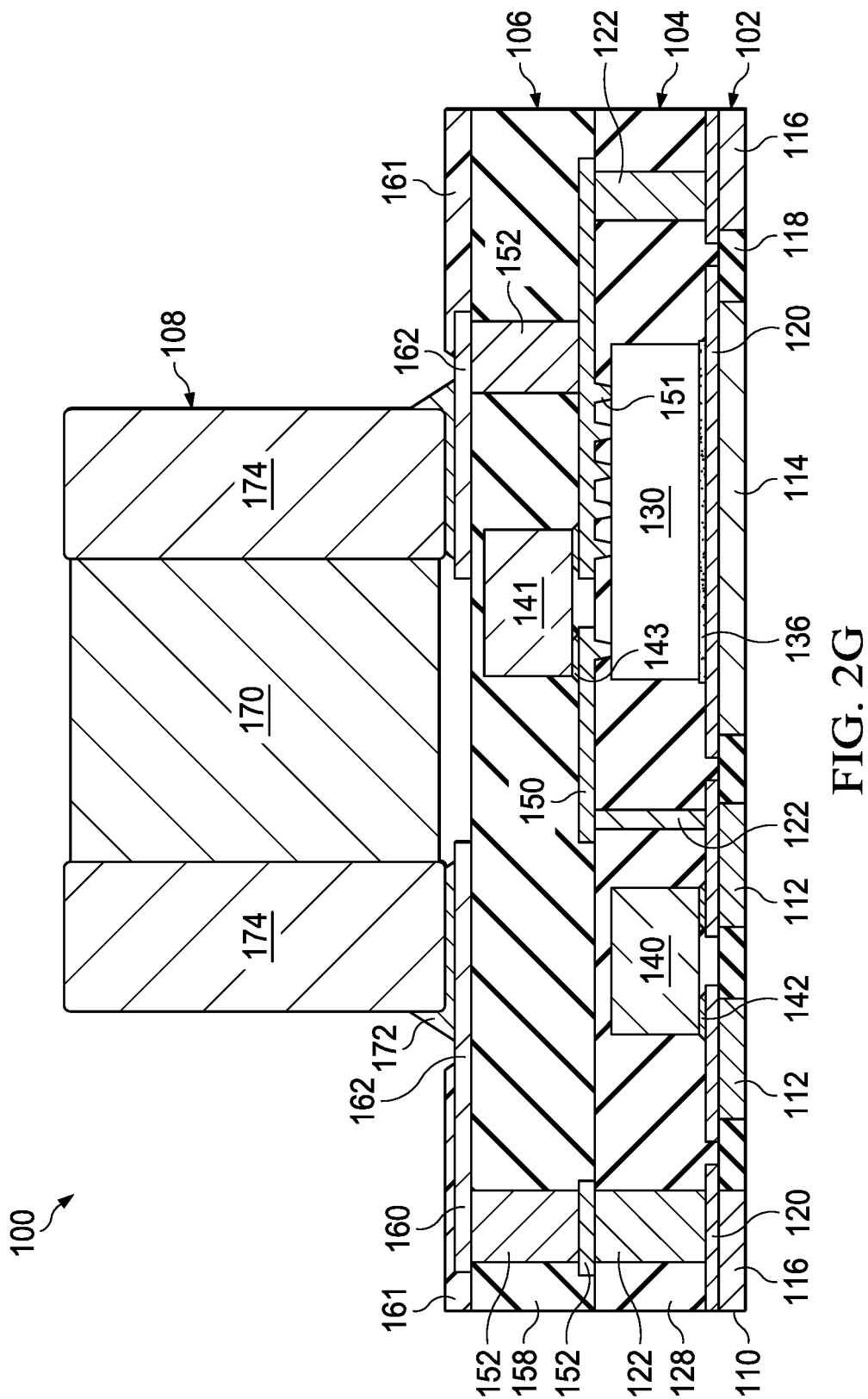

As represented by FIG. 2G, third layer 108 is added over metal pillars 152 and metal trace 160. In this example, third layer 108 include inductors 170 with inductor terminals 174. Specifically, inductor terminals 174 are placed over one or more metal pillars 152 to electrically couple the inductor 170 to metal pillars 152 (FIG. 3, step 212). In some examples, inductor terminals 174 may be placed adjacent to metal pillars 152, in other examples, metal trace 160 may provide electrical routing to connect inductor terminals 174 to metal pillars 152. In various examples, solder bonding with electrically conductive adhesive material 172, or metal-to-metal bonding may be used to connect inductor terminals 174 to metal pillars 152.

As further represented by FIG. 2G, after placing the inductor 170 over metal pillars 152, semiconductor package 100 is removed from carrier 10. Removing semiconductor package 100 from carrier 10 may include deactivating an adhesive securing semiconductor package 100 to carrier 10, such as by applying UV light or heat.

In some examples, semiconductor package 100 may be one of an array of packages manufactured on an array of interconnected leadframes. In such examples, the method further includes singulating the array of molded packages to form individual semiconductor packages 100. Singulation may include cutting through any dielectric material and tie bars linking the interconnected leadframes with a saw or other cutting implement.

Figure 4A:
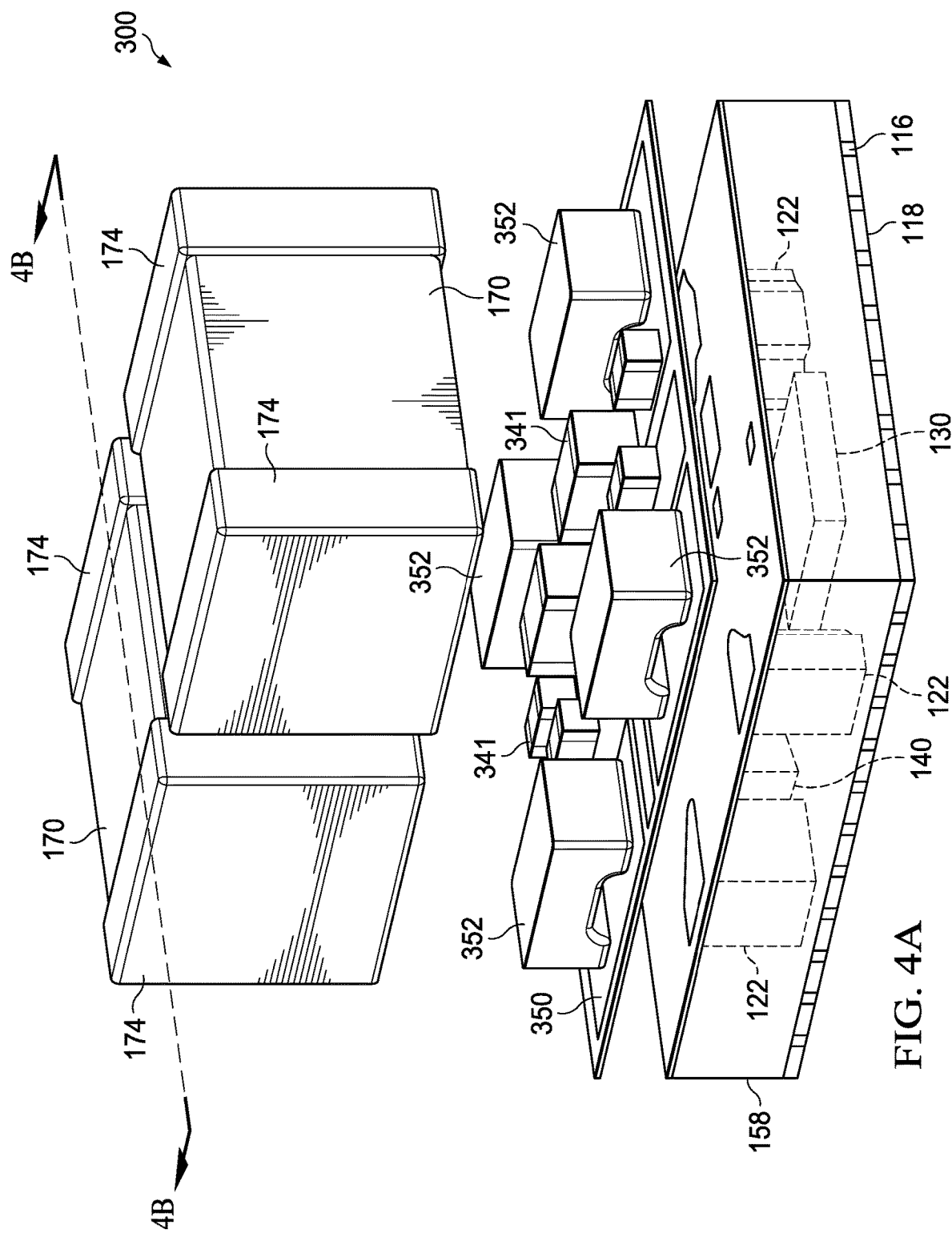
FIGS. 4A and 4B illustrate a multilayer package with an embedded semiconductor die, and two open layers each including passive components stacked over the embedded semiconductor die layer.
Figure 4B:
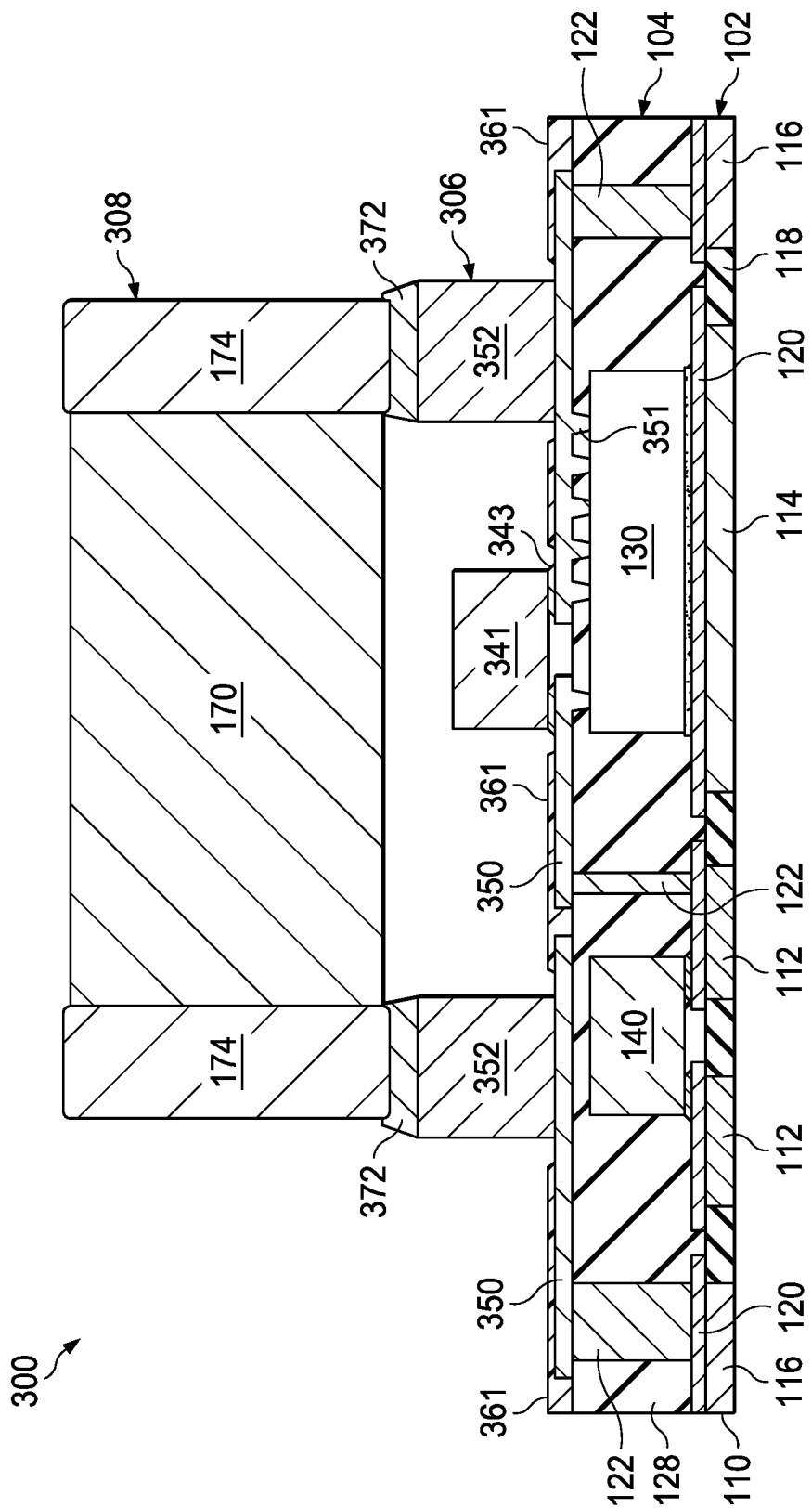

FIG. 4A shows an exploded perspective view of semiconductor package 300, and FIG. 4B illustrates a cross-sectional view of package 300. Package 300 is substantially similar to semiconductor package 100 except that package 300 includes two open layers in a stacked configuration above first layer 104 with an embedded die 130. Elements of package 300 with the same numbers as semiconductor package 100 are the same or substantially similar to those elements in semiconductor package 100. For brevity, such elements are described in limited or no detail with respect to package 300.

In package 300, base layer 102 and first layer 104 are substantially similar to the same elements of semiconductor package 100. For example, semiconductor die 130 and other components first layer 104, such as passive component 140, include terminals or other electrical contacts physically and electrically connected to a metal trace 120 on leadframe 110 and base layer dielectric substrate 118 of base layer 102.

Metal trace 350 is patterned on first layer 104 and extends over dielectric substrate 128 and the distal ends of metal pillars 122. Second layer 306 is stacked on first layer 104 such that a second set of metal pillars 352 are electrically coupled to metal pillars 122 via metal trace 350. The bond pads of semiconductor die 130 are electrically coupled to metal trace 350 patterned on dielectric substrate 128. Specifically, dielectric substrate 128 includes vias 351 filled with the conductive material of metal trace 350 over the bond pads, electrically connecting the functional circuitry of semiconductor die 130 to metal trace 350. A solder mask layer 361 covers portions of metal trace 350 but contact areas for metal pillars 352 and passive component 341 remain exposed.

Passive components 341 and other components of second layer 306, if any, include terminals or other electrical contacts physically and electrically connected to metal trace 350. Portions of metal trace 350 are covered by solder mask layer 351, leaving exposed electrical contacts to facilitate electrical connections with components of second layer 306. For example, passive component 341 includes electrically conductive adhesive material connections 343, including solder or Ag-Sintered material, to metal trace 350. In some examples, passive component 341 includes at least one capacitor and/or resistor. As semiconductor package 300 does not include a dielectric substrate in second layer 306, the components of second layer 306 remain exposed rather than embedded within a dielectric layer. Thus, the electrical components of second layer 306 are surface-mount components.

Metal pillars 352 extend from metal trace 350 to an opposing side of second layer 306 to provide electrical connections to components of third layer 308, including inductors 170. Metal pillars 352 may be plated metal pillars as described with respect to metal pillars 152.

Inductor 170 remains exposed on an outer surface of semiconductor package 300 rather than embedded within a dielectric layer. In this manner, the electrical components of third layer 308 are surface-mount components. Each inductor 170 includes inductor terminals 174, each inductor terminal 174 being directly coupled to one or more metal pillars 352 via electrically conductive adhesive material connections 372, including solder or Ag-Sintered material.

Figure 5:
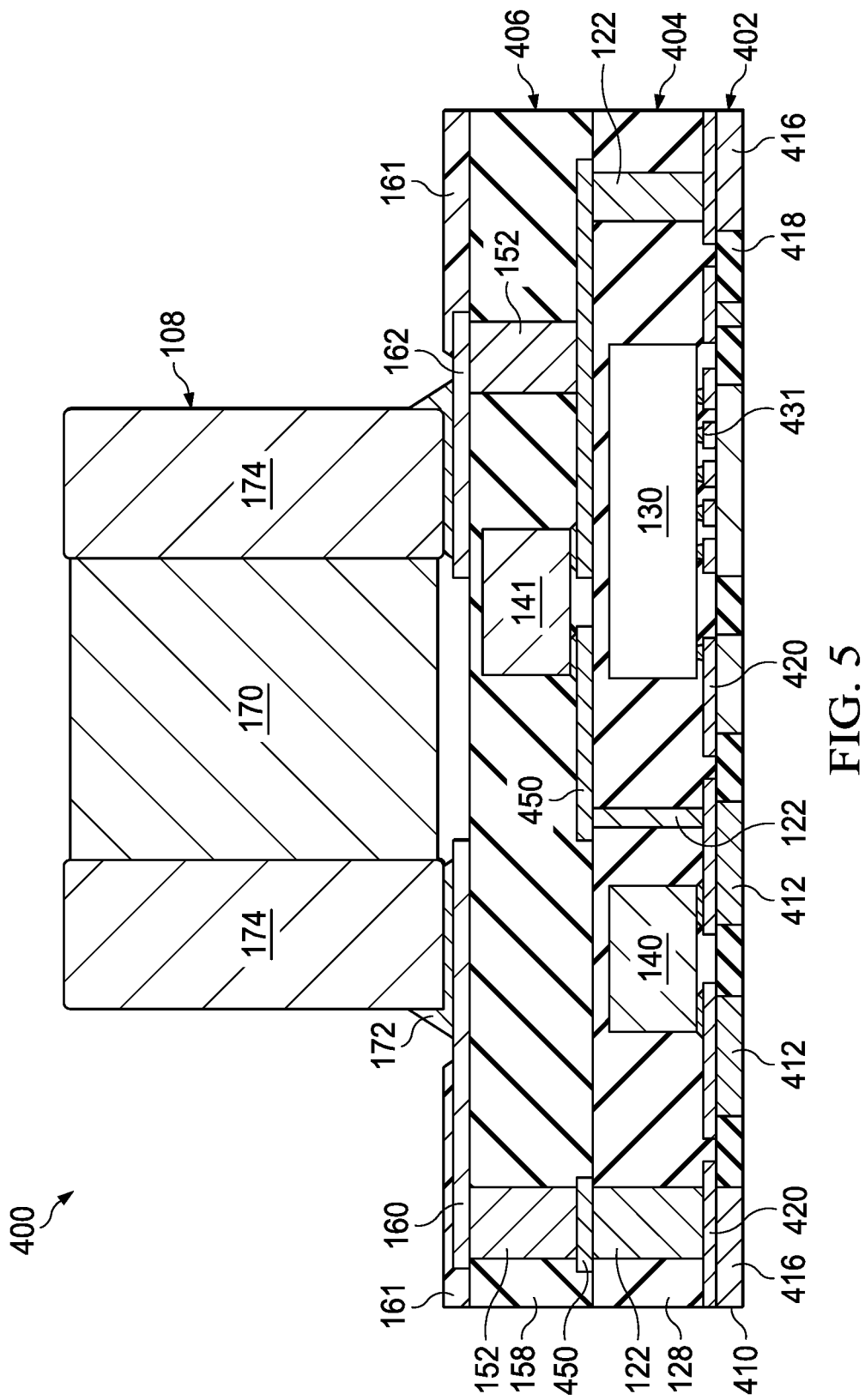
FIG. 5 illustrates a multilayer package with an embedded semiconductor die in a flip-chip arrangement, and additional package layers including passive components.

FIG. 5 illustrates semiconductor package 400. Semiconductor package 400 is substantially similar to semiconductor package 100 except that semiconductor die 430 is in a flip-chip arrangement on leadframe 410. Elements of semiconductor package 400 with the same numbers as semiconductor package 100 are the same or substantially similar to those elements in semiconductor package 100. For brevity, such elements are described in limited or no detail with respect to semiconductor package 400.

Semiconductor package 400 includes a first layer 404 including a semiconductor die 430 and passive component 140 embedded in a dielectric substrate 128, a second layer 406 including passive components 141 embedded in a dielectric substrate 158, and a third layer 108 including surface-mount components including inductors 170. Semiconductor package 400 also includes a base layer 402 including a leadframe 410 and a base layer dielectric substrate 418 filling gaps between the elements of the leadframe 410. The conductive elements of leadframe 410 include perimeter contacts 416, interior vias 412, and die contacts 431.

A metal trace 420 is metal plating layer patterned on base layer 402 and extends over leadframe 410 and base layer dielectric substrate 418. First layer 404 is stacked on base layer 402 such that a set of metal pillars 122 embedded in dielectric substrate 128 are electrically coupled to leadframe 410 via metal trace 420. Specifically, metal pillars 122 are electrically coupled to elements of leadframe 410 via metal trace 120. In addition, passive component 140 includes electrical terminals physically and electrically connected to metal trace 420.

The active surface of semiconductor die 430 adjacent to and in physical contact with metal trace 420 and/or leadframe 410 in a flip-chip arrangement. For example, in some examples, metal trace 420 may represent a plating layer over the portions of leadframe 410 providing electrical connections to semiconductor die 430. In other examples, metal trace 420 may route signals between semiconductor die 430 and conductive elements of leadframe 410. Such examples may include a solder mask layer separating trace 420 from leadframe 410.

A second metal trace 450 is patterned on first layer 404 and extends over dielectric substrate 128 and the distal ends of metal pillars 122. Second layer 406 is stacked on first layer 404 such that a second set of metal pillars 152 are electrically coupled to metal pillars 122 via metal trace 150. Metal pillars 122 extend through dielectric substrate 128 to provide electrical connections between metal traces 420, 450. Passive components 141 and other components of second layer 106, if any, include terminals or other electrical contacts physically and electrically connected to metal trace 450. In some examples, passive components 141 include at least one capacitor and/or resistor.

A metal trace 160 is patterned on second layer 406 and extends over dielectric substrate 158, and metal pillars 152 extend from metal trace 150 to an opposing side of second layer 406, through dielectric substrate 158, to provide electrical connections between metal traces 450, 160. Third layer 108, including inductors 170, is stacked on second layer 106. Inductor 170 remains exposed on an outer surface of semiconductor package 100 rather than embedded within a dielectric layer.

In this manner, metal pillars 122, 152 and metal traces 420, 450, 160 provide routable three-dimensional electrical connections between leadframe 410 and the components of first layer 404, second layer 406 and third layer 108.

The specific techniques for multilayer packages with an embedded semiconductor die, and additional package layers including passive components, including techniques described with respect to packages 100, 300, 400, are merely illustrative of the general inventive concepts included in this disclosure as defined by the following claims.

What is claimed is:

1. A method of making a semiconductor package, comprising:
   providing a base layer including a leadframe and a base layer dielectric substrate, the leadframe including a conductive die attach pad;
   providing a first layer stacked on the base layer, the first layer including a semiconductor die mounted on the conductive die attach pad and embedded within a dielectric substrate of the first layer, and a first set of metal pillars extending through the dielectric substrate of the first layer;
   providing a second layer stacked on the first layer, the second layer including a metal trace patterned on the dielectric substrate of the first layer, a passive component including at least one capacitor or resistor electrically coupled to the metal trace, and a second set of metal pillars extending from the metal trace to an opposing side of the second layer; and
   providing a third layer stacked on the second layer, the third layer including at least one inductor electrically coupled to metal pillars of the second set of metal pillars.

2. The method of claim 1,
   wherein the semiconductor die includes bond pads providing electrical connections to functional circuitry of the semiconductor die,
   wherein the dielectric substrate of the first layer forms vias over the bond pads, and
   wherein the metal trace fills the vias, electrically connecting the functional circuitry to the metal trace.

3. The method of claim 1,
   wherein the dielectric substrate of the first layer is a first dielectric substrate, the second layer further including a second dielectric substrate,
   wherein the passive component is embedded in the second dielectric substrate, and
   wherein the second set of metal pillars extend through the second dielectric substrate.

4. The method of claim 1, wherein the inductor is exposed on an outer surface of the semiconductor package.

5. The method of claim 1, wherein the first set of metal pillars are electrically coupled to perimeter contacts and interior vias of the leadframe.

6. The method of claim 1,
   wherein an inactive surface of the semiconductor die is bonded to the conductive die attach pad,
   wherein the semiconductor die includes bond pads providing electrical connections to functional circuitry of the semiconductor die, and
   wherein the bond pads are electrically coupled to the metal trace.

7. The method of claim 1,
   wherein the metal trace is a first metal trace,
   wherein the first layer further includes a second metal trace over the leadframe, and
   wherein the semiconductor die and the first set of metal pillars are adjacent to the second metal trace.

8. The method of claim 5, wherein the base layer dielectric substrate fills gaps between the conductive die attach pad, perimeter contacts, and interior vias of the leadframe.

9. A method of making a semiconductor package comprising:
   providing a base layer including a leadframe and a base layer dielectric substrate filling gaps between conductive elements of the leadframe, the conductive elements including a die attach pad, perimeter contacts, and interior vias;
   providing a first layer including a semiconductor die mounted on the die attach pad and embedded within a second dielectric substrate, and a first set of metal pillars extending through the second dielectric substrate,
   wherein the first layer is stacked on the base layer such that the first set of metal pillars are electrically coupled to the perimeter contact and interior vias of the leadframe;
   providing a second layer stacked on the first layer, the second layer including a metal trace patterned on the second dielectric substrate, a passive component including at least one capacitor or resistor electrically coupled to the metal trace, and a second set of metal pillars extending from the metal trace to an opposing side of the second layer; and
   providing a third layer stacked on the second layer, the third layer including at least one inductor electrically coupled to metal pillars of the second set of metal pillars,
   wherein the inductor is exposed on an outer surface of the semiconductor package.

10. The method of claim 9,
    wherein the semiconductor die includes bond pads providing electrical connections to functional circuitry of the semiconductor die,
    wherein the second dielectric substrate forms vias over the bond pads, and
    wherein the metal trace fills the vias, electrically connecting the functional circuitry to the metal trace.

11. The method of claim 9,
wherein an inactive surface of the semiconductor die is bonded to the die attach pad,
wherein the semiconductor die includes bond pads providing electrical connections to functional circuitry of the semiconductor die, and
wherein the bond pads are electrically coupled to the metal trace.

12. The method of claim 9,
wherein the second layer further includes a third dielectric substrate,
wherein the passive component is embedded in the third dielectric substrate, and
wherein the second set of metal pillars extend through the third dielectric substrate.

13. A semiconductor package, comprising:
a base layer including a leadframe and a base layer dielectric substrate, the leadframe including a conductive die attach pad;
a first layer stacked on the base layer, the first layer including a semiconductor die mounted on the conductive die attach pad and embedded within a dielectric substrate of the first layer, and a first set of metal pillars extending through the dielectric substrate of the first layer;
a second layer stacked on the first layer, the second layer including a metal trace patterned on the dielectric substrate of the first layer, a passive component including at least one capacitor or resistor electrically coupled to the metal trace, and a second set of metal pillars extending from the metal trace to an opposing side of the second layer; and
a third layer stacked on the second layer, the third layer including at least one inductor electrically coupled to metal pillars of the second set of metal pillars.

14. The semiconductor package of claim 13,
wherein the semiconductor die includes bond pads providing electrical connections to functional circuitry of the semiconductor die,
wherein the dielectric substrate of the first layer forms vias over the bond pads, and
wherein the metal trace fills the vias, electrically connecting the functional circuitry to the metal trace.

15. The semiconductor package of claim 13,
wherein the dielectric substrate of the first layer is a first dielectric substrate, the second layer further including a second dielectric substrate,
wherein the passive component is embedded in the second dielectric substrate, and
wherein the second set of metal pillars extend through the second dielectric substrate.

16. The semiconductor package of claim 13, wherein the inductor is exposed on an outer surface of the semiconductor package.

17. The semiconductor package of claim 13, wherein the first set of metal pillars are electrically coupled to perimeter contacts and interior vias of the leadframe.

18. The semiconductor package of claim 13,
wherein an inactive surface of the semiconductor die is bonded to the conductive die attach pad,
wherein the semiconductor die includes bond pads providing electrical connections to functional circuitry of the semiconductor die, and
wherein the bond pads are electrically coupled to the metal trace.

19. The semiconductor package of claim 3,
wherein the metal trace is a first metal trace,
wherein the first layer further includes a second metal trace over the leadframe, and
wherein the semiconductor die and the first set of metal pillars are adjacent to the second metal trace.

20. The semiconductor package of claim 17, wherein the base layer dielectric substrate fills between the conductive die attach pad, perimeter contacts, and interior vias of the leadframe.

21. A semiconductor package comprising:
a base layer including a leadframe and a base layer dielectric substrate filling gaps between conductive elements of the leadframe, the conductive elements including a die attach pad, perimeter contacts, and interior vias;
a first layer including a semiconductor die mounted on the die attach pad and embedded within a second dielectric substrate, and a first set of metal pillars extending through the second dielectric substrate,
wherein the first layer is stacked on the base layer such that the first set of metal pillars are electrically coupled to the perimeter contacts and interior vias of the leadframe;
a second layer stacked on the first layer, the second layer including a metal trace patterned on the second dielectric substrate, a passive component including at least one capacitor or resistor electrically coupled to the metal trace, and a second set of metal pillars extending from the metal trace to an opposing side of the second layer; and
a third layer stacked on the second layer, the third layer including at least one inductor electrically coupled to metal pillars of the second set of metal pillars,
wherein the inductor is exposed on an outer surface of the semiconductor package.

22. The semiconductor package of claim 21,
wherein the semiconductor die includes bond pads providing electrical connections to functional circuitry of the semiconductor die,
wherein the second dielectric substrate forms vias over the bond pads, and
wherein the metal trace fills the vias, electrically connecting the functional circuitry to the metal trace.

23. The semiconductor package of claim 21,
wherein an inactive surface of the semiconductor die is bonded to the die attach pad,
wherein the semiconductor die includes bond pads providing electrical connections to functional circuitry of the semiconductor die, and
wherein the bond pads are electrically coupled to the metal trace.

24. The semiconductor package of claim 21,
wherein the second layer further includes a third dielectric substrate,
wherein the passive component is embedded in the third dielectric substrate, and
wherein the second set of metal pillars extend through the third dielectric substrate.

* * * * *